United States Patent
Peterson

(10) Patent No.: US 9,443,923 B2
(45) Date of Patent: Sep. 13, 2016

(54) SUBSTRATE FOR MOLECULAR BEAM EPITAXY (MBE) HGCDTE GROWTH

(71) Applicant: Raytheon Company, Waltham, MA (US)

(72) Inventor: Jeffrey M. Peterson, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 92 days.

(21) Appl. No.: 14/271,727

(22) Filed: May 7, 2014

(65) Prior Publication Data

US 2015/0325661 A1    Nov. 12, 2015

(51) Int. Cl.
*H01L 21/46* (2006.01)
*H01L 29/04* (2006.01)
*H01L 29/32* (2006.01)
*H01L 21/02* (2006.01)

(52) U.S. Cl.
CPC ......... *H01L 29/04* (2013.01); *H01L 21/02381* (2013.01); *H01L 21/02433* (2013.01); *H01L 21/02562* (2013.01); *H01L 21/02631* (2013.01); *H01L 29/045* (2013.01); *H01L 29/32* (2013.01)

(58) Field of Classification Search
CPC ............................... H01L 29/32; H01L 29/45
USPC ......................................................... 438/455
See application file for complete search history.

(56) References Cited

U.S. PATENT DOCUMENTS 7,518,207 B1 * 4/2009 Chen ................. H01L 21/02381
257/442
2008/0099839 A1 * 5/2008 Rachmady ........ H01L 21/76251
257/347
2010/0244100 A1 * 9/2010 Oishi .................... C23C 16/303
257/201
2012/0139072 A1   6/2012 Black et al.
2013/0119401 A1 * 5/2013 D'Evelyn ......... H01L 21/02609
257/76

OTHER PUBLICATIONS

Tong, Semiconductor Wafer Bonding, 1999, pp. 2, 5, 12, and 13. John Wiley & Sons, United States of America.
Shimbo et al, "Silicon-silicon direct bonding method", 1986, J. Appl. Phys 60, 2987, Abstract Only.
Gracias, Meeting at the Brazilian Vacuum Society, Campinas, Brazil, Jul. 1998, Published in Rev. Bras. Aplic, Vacuo, 19, 19-22 (2000).
"Czochraiski Process;" Wikipedia; 2 pages.

* cited by examiner

*Primary Examiner* — Bradley K Smith
(74) *Attorney, Agent, or Firm* — Daly, Crowley, Mofford & Durkee, LLP

(57) ABSTRACT

A semiconductor structure having a first semiconductor body having an upper surface with a non <211> crystallographic orientation and a second semiconductor body having a surface with a <211> crystallographic orientation, the surface of the second semiconductor body being bonded to a bottom surface of the first semiconductor body. A layer comprising CdTe is epitaxially disposed on the upper surface of the second semiconductor body. The second semiconductor body is CZ silicon, has a thickness less than 10 microns and has a diameter of at least eight inches. A getter having micro-cavities has a bottom surface formed on an upper surface of the first semiconductor body and has an upper surface bonded to a bottom surface of the second semiconductor body.

15 Claims, 4 Drawing Sheets

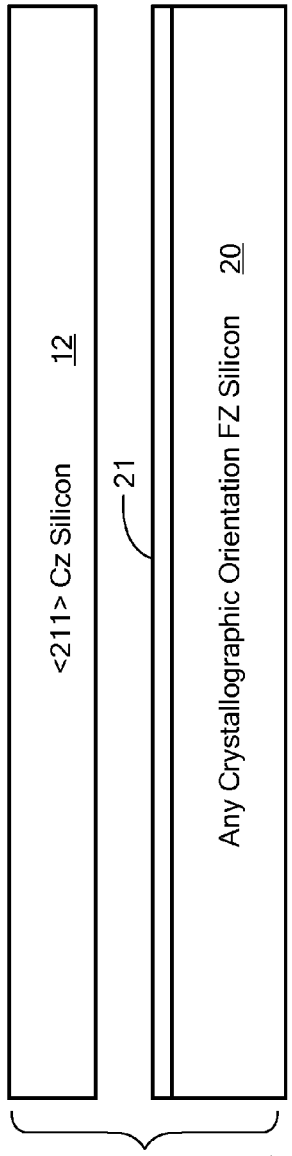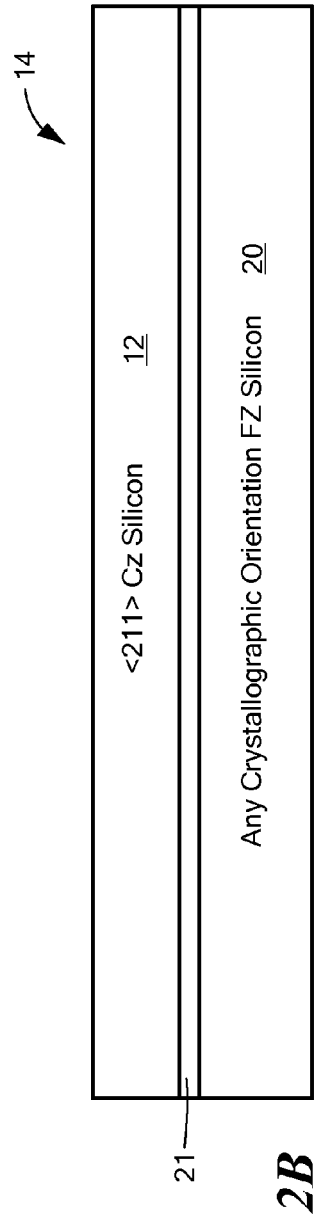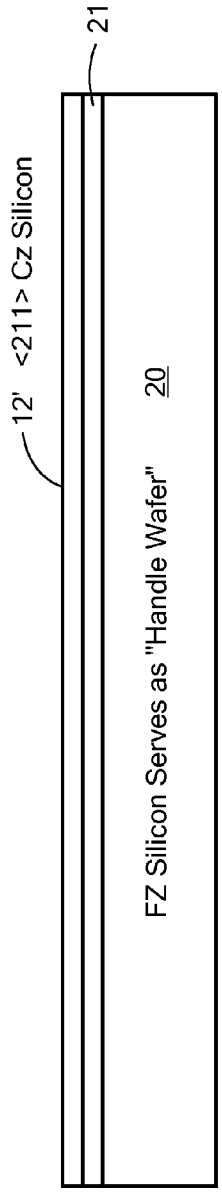

SUBSTRATE FOR MOLECULAR BEAM EPITAXY (MBE) HGCDTE GROWTH

TECHNICAL FIELD

This disclosure relates generally to semiconductor substrates and more particularly to semiconductor substrates for MBE growth of mercury cadmium telluride (HgCdTe) devices.

BACKGROUND

As is known in the art, cryogenic infrared detectors are typically made of small band gap (about 0.1-0.2 eV) semiconductors such as HgCdTe (mercury cadmium telluride) grown on a semiconductor substrate, such as a silicon substrate, using molecular beam epitaxy (MBE). In order for proper crystallographic epitaxial growth, the silicon surface upon which the HgCdTe is MBE grown should have a <211> crystallographic orientation. Also, the wafers should have sufficient support thicknesses, typically at least in the order of 100 microns.

As is also known in the art, many imaging application require large arrays of the detectors on a single substrate, or wafer; preferably at least eight inches in diameter. While, eight inch diameter Float Zone (FZ) silicon wafers are readily available, these wafers have surfaces with a <100> crystallographic orientation and are therefore not suitable for MBE formation of the HgCdTe detectors. While silicon wafers produced by the Czochralski (CZ) process produces silicon wafers (CZ silicon wafers) having a surface with a <211> orientation, the CZ silicon wafers having thickness in the order of 100 microns are undesirable in many application because oxygen impurities therein absorb light in many frequency bands where radiation detection is required as in LWIR applications. Further, eight inch diameter CZ silicon wafers with surfaces having a <211> orientation are not readily available.

SUMMARY

In accordance with the present disclosure, a semiconductor structure is provided, comprising: a first semiconductor body having an upper surface with a non <211> crystallographic orientation; a second semiconductor body having a surface with a <211> crystallographic orientation, the surface of the second semiconductor body being bonded to a bottom surface of the first semiconductor body.

In one embodiment, the structure includes a layer comprising CdTe epitaxially disposed on the upper surface of the second semiconductor body.

In one embodiment, the second semiconductor body is CZ silicon.

In one embodiment, the second semiconductor body has a thickness less than 10 microns.

In one embodiment, the second semiconductor body has a diameter of at least eight inches.

In one embodiment, the first semiconductor body and the second semiconductor body are of the same semiconductor material.

In one embodiment, the second semiconductor body has a thickness at least an order of magnitude thinner than the thickness of the first semiconductor body.

In one embodiment, a semiconductor structure is provided, comprising: a first semiconductor body; a getter layer; and a second semiconductor body. The getter layer has a bottom surface formed on an upper surface of the first semiconductor body and has an upper surface bonded to a bottom steam of the second semiconductor body.

In one embodiment, the getter layer has nanocavities.

In one embodiment, the first semiconductor body is FZ silicon.

With such an arrangement, wafer bonding is used to bond a readily available <211> CZ wafer to an ordinary orientation Float Zone silicon wafer. After water bonding, the <211> CZ wafer is then thinned so that it does not appreciably absorb LWIR radiation, and the FZ wafer serves only as an LWIR transparent handle wafer. This arrangement: an LWIR compatible 8-in diameter substrate for MBE growth and focal plane arrays is obtained without having to obtain an 8-in diameter <211> FZ silicon wafer; enables placing an impurity getter layer in the benign location between the two substrates in close proximity to the HgCdTe; and eases supply chain issues associated with <211> silicon (Si) substrates. The use of wafer bonding of two more readily available wafers to replace a difficult to obtain wafer will enable the engineered silicon substrate to be a manufactured product with more predictable lead times and better quality control.

DESCRIPTION OF DRAWINGS

Like reference symbols in the various drawings indicate like elements.

DETAILED DESCRIPTION

Figure 1A:
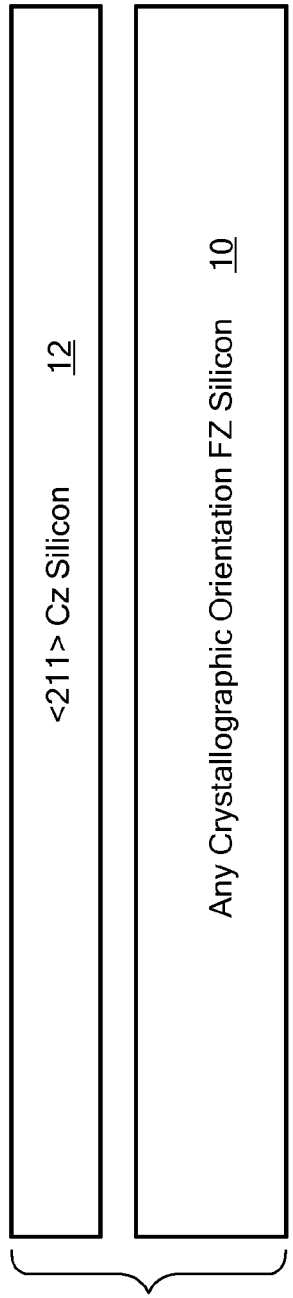
FIGS. 1A-1E are diagrammatical cross sectional sketches of a process used to form an array of photo-detectors at various stages in the fabrication thereof in accordance with the disclosure; and, FIGS. 2A-2E are diagrammatical cross sectional sketches of a process used to form an array of photo-detectors at various stages in the fabrication thereof in accordance with another embodiment of the disclosure.

Referring now to FIG. 1A, a semiconductor wafer 10, here an FZ silicon wafer, is shown. Here, the wafer 10 is an eight inch diameter wafer have an upper surface with a <100> crystallographic orientation. It should be understood that the wafer 10 here has <100> crystallographic orientation, other crystallographic orientations may be used. The thickness of the wafer 10 is here, for example, 100 microns. Also shown in FIG. 1A is a semiconductor wafer 12, here an eight inch diameter CZ silicon wafer, disposed above the upper surface of wafer 10; the wafer 12 having a top and bottom surfaces each with a <211> crystallographic orientation. The thickness of wafer 12 is here, for example, 100 microns.

Figure 1B:
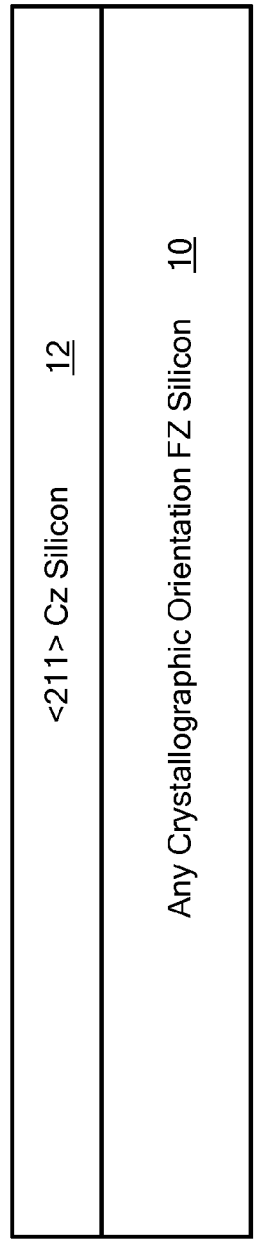

Referring now to FIG. 1B, the top surface of wafer 10 and bottom surface of wafer 12 are cleaned and polished and then bonded together in an oxide free environment to form an atomic bond between the two wafers 10, 12, to form structure 14, as indicated. Because the wafer bond interface will be silicon-to-silicon, the bonding is likely to be a combination of atomic bonding and Van der Waal's attraction.

Figure 1C:
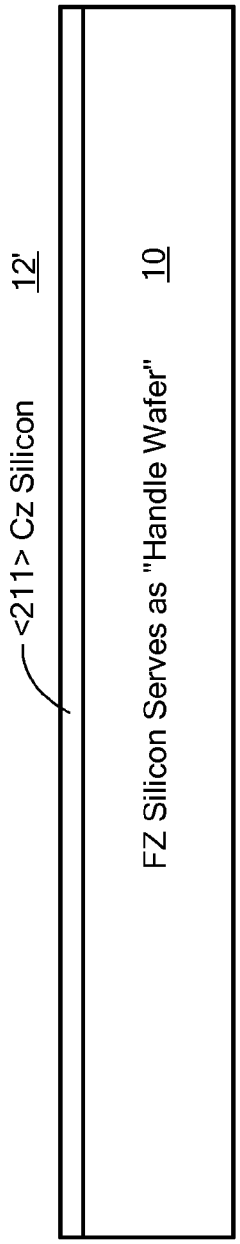

Next, referring to FIG. 1C, the upper surface of the wafer 12 is polished, for example using standard silicon semiconductor polishing methods to achieve a smooth, particle free surface, to reduce the thickness of the wafer 12 to a wafer 12' having a thickness thick enough for handling until it can be wafer bonded to the handle wafer, for example, as thin as 100 µm. After wafer bonding is complete, the <211> wafer can be thinned to its final thickness ~5 µm so as not to appreciably absorb LWIR IR radiation. It is noted that the wafer 10 serves as a handle for the thinned wafer 12' and that the upper surface of the thinned wafer 12; has a <211> crystallogaphic orientation.

Figure 1D:
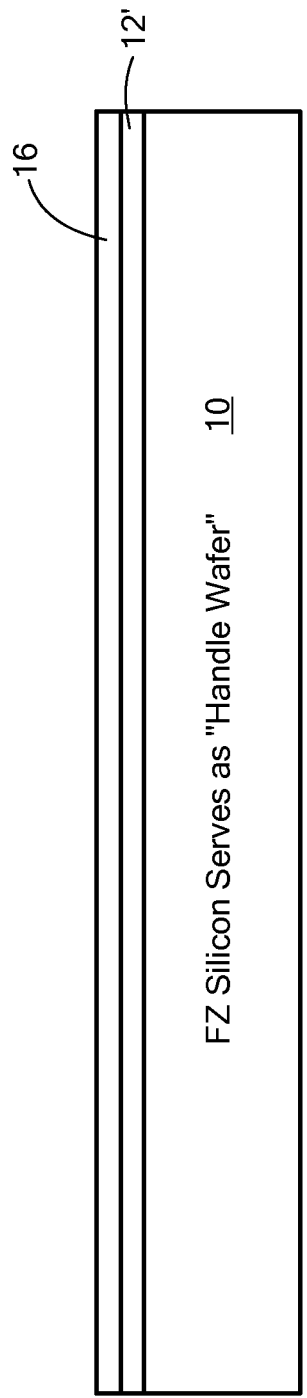

Next, referring to FIG. 1D, a layer 16 of HgCdTe is formed using MBE on the upper surface of the thinned wafer 12'.

Figure 1E:
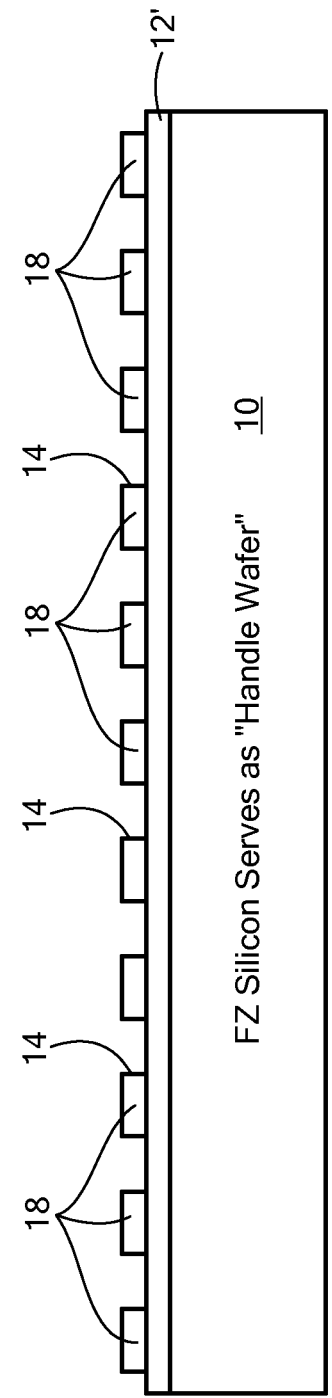

Here, referring to FIG. 1E, an array of HgCdTe detectors 18 is formed in the layer 16 using conventional photolithographic-etching processing. Thus, an array of HgCdTe photo-detectors has been formed on an eight inch diameter substrate, here the structure 14, using MBE on a surface (the upper surface of the thinned, and hence low oxygen impurity, CZ wafer 12') having a <211> crystallographic orientation.

Referring now to FIG. 2A, a semiconductor wafer 20, here an FZ silicon wafer, is shown. Here, the wafer 20 is an eight inch diameter wafer have an upper surface with a <100> crystallographic orientation. It should be understood that other semiconductor materials may be used as well as other crystallographic orientations for the surface. The thickness of the wafer 20 is here, for example, 100 microns. Here, the upper surface of wafer 20 has a getter layer 21, here a layer formed with nanocavities by, for example, implanting ion of helium into the surface of either wafer at the bonding interface between layers 12 and 20, as shown in FIG. 2A. In either case, the formation of the guttering layer 21 must occur before wafer bonding (thereby putting the gettering layer buried in the bondline between, protecting it from both the MBE growth process and the wafer fabrication process), followed by the application of heat to form bubbles in the upper surface of wafer 20. The getter layer 21 to be used to trap impurities in the environment, such as, for example, copper. More particularly, the internal surfaces of the bubbles formed by the nanocavities trap the impurities.

Referring now to FIG. 2B, the top surface of wafer 12 and bottom surface of wafer 22 are cleaned and polished and cleaned to form oxide free surfaces and then bonded together in a clean environment to form an atomic bond between the two wafers 20, 12, to form structure 14, as indicated. The gettering layer 21 will attract undesired metallic impurities such as copper so that the impurities will not affect the HgCdTe to be grown onto the wafer.

Next, referring to FIG. 2C, the upper surface of the wafer 12 is polished, as described in connection with FIG. 1C to reduce the thickness of the wafer 12 to the wafer 12' having a thickness in the range between 5-10 μm although it may be possible to be as thin as 2 μm if a high degree of polishing is provided. It is noted that the wafer 20 serves as a handle for the thinned wafer 12' and that the upper surface of the thinned wafer 12; has a <211> crystallographic orientation.

Figure 2D:
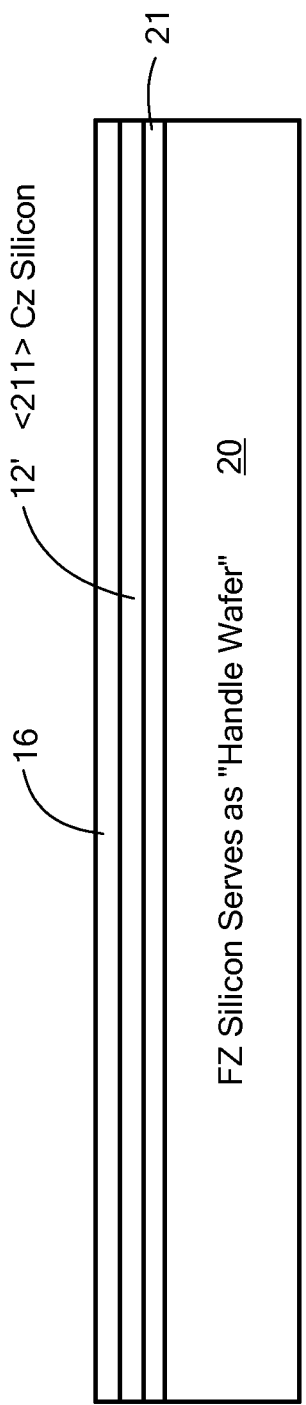

Next, referring to FIG. 2D, the layer 16 of HgCdTe is formed using MBE on the upper surface of the thinned wafer 12,' as described in connection with FIG. 1C.

Figure 2E:
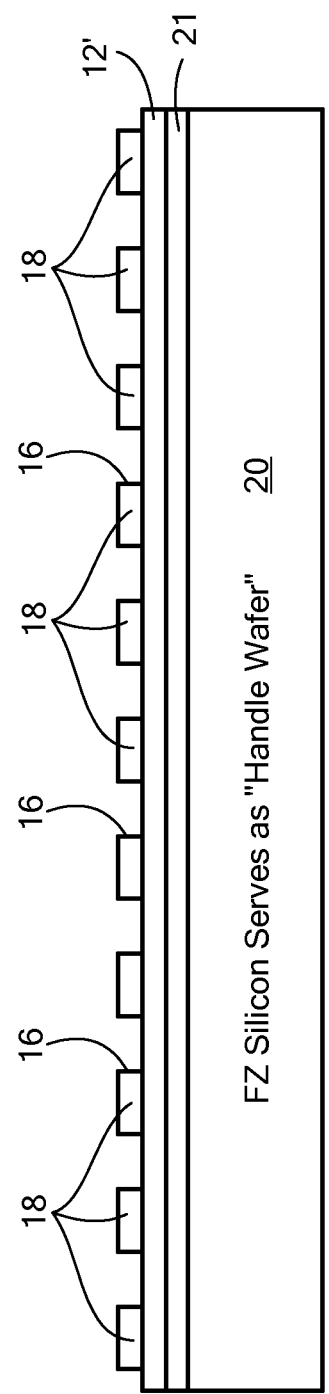

Here, referring to FIG. 2E, an array of HgCdTe detectors is formed in the layer 16 using conventional photolithographic-etching processing as described in connection with FIG. 1D. Thus, an array of HgCdTe photo-detectors 18 has been formed on an eight inch diameter substrate, here the structure 14, using MBE on a surface (the upper surface of the thinned, and hence low oxygen impurity, CZ wafer 12') having a <211> crystallographic orientation having an internal, buried, getter layer 21.

A summary of the process is as follows:

1. Obtain a growth wafer having <211> crystallographic orientation a handle wafer having a Non <211> crystallographic orientation
2. If not pre-thinned, then thin the <211> crystallographic orientation growth wafer to ~100 μm
3. Create a gettering layer on either one or both wafers
4. Bond the wafers together with gettering layer(s) at the interface
5. If required, thermally activate gettering layer.
6. Thin the <211> crystallographic orientation wafer to or less to minimize LWIR loss. The surface of the thinned <211> crystallographic orientation side needs to be smooth and substantially particle free so that it is capable of supporting the epitaxial growth of HgCdTe. The backside of the handle wafer also needs to be polished to enable the transmission of IR radiation through it.

A number of embodiments of the disclosure have been described. Nevertheless, it will be understood that various modifications may be made without departing from the spirit and scope of the disclosure. For example, smaller wafer diameters, variations in the growth handle wafer such as CZ to CZ or FZ to FZ. Accordingly, other embodiments are within the scope of the following claims.

What is claimed is:

1. A semiconductor structure, comprising:
   a first semiconductor body having an upper surface with a non <211> crystallographic orientation;
   a second semiconductor body having an upper surface with a <211> crystallographic orientation, a bottom surface of the second semiconductor body being bonded to an upper surface of the first semiconductor body;
   an epitaxial layer comprising CdTe disposed on the upper surface of the second semiconductor body;
   wherein a bottom surface of the second semiconductor body is a directly bonded to an upper surface of the first semiconductor body.

2. The semiconductor structure recited in claim 1 wherein the second semiconductor body has a thickness at least an order of magnitude greater than the thickness of the first semiconductor body.

3. The semiconductor structure recited in claim 1 wherein the bonding is a direct first semiconductor body-to-second semiconductor bonding.

4. The semiconductor structure recited in claim 3 wherein the first semiconductor body is silicon and the second semiconductor body is silicon and wherein the bonding is a direct silicon-to-silicon bonding.

5. The semiconductor structure recited in claim 1 wherein the second semiconductor body is CZ silicon.

6. The semiconductor structure recited in claim 5 wherein the first semiconductor body is FZ silicon.

7. The semiconductor structure recited in claim 6 wherein the second semiconductor body has a diameter of at least eight inches.

8. The semiconductor structure recited in claim 1 wherein the first semiconductor body and the second semiconductor body are of the same semiconductor material.

9. The semiconductor body recited in claim 8 wherein the second semiconductor body is CZ silicon.

10. The semiconductor structure recited in claim 9 wherein the first semiconductor body is FZ silicon.

11. The semiconductor structure recited in claim 10 wherein the second semiconductor body has a diameter of at least eight inches.

12. The semiconductor structure recited in claim 8 wherein the second semiconductor body has a thickness at least an order of magnitude thinner than the thickness of the first semiconductor body.

13. The semiconductor structure recited in claim 1 wherein the bonding is a combination of atomic bonding and Van der Waal's attraction.

14. A method for forming a semiconductor structure, comprising:
   providing a first semiconductor body having an upper surface with a non <211> crystallographic orientation;
   providing a second semiconductor body having an upper surface with a <211> crystallographic orientation;
   directly bonding an upper surface of the first semiconductor body to a bottom surface of the second semiconductor body;
   thinning the second semiconductor body to a thickness less than the thickness of the first semiconductor body; and
   epitaxially forming a layer comprising CdTe on the upper surface of the thinned second semiconductor body.

15. The method recited in claim 14 wherein the first semiconductor body and the second semiconductor body have predetermined thicknesses in the same order of magnitude prior to the thinning of the second semiconductor body and wherein the thinning of the second semiconductor body reduces the thickness of the second semiconductor body at least an order of magnitude.

* * * * *